United States Patent
Augais

(10) Patent No.: US 10,488,444 B2
(45) Date of Patent: Nov. 26, 2019

(54) DEVICE FOR MEASURING A MAGNETIC FIELD

(71) Applicant: ATWARE, Saint Cyr sous Dourdan (FR)

(72) Inventor: Thierry Augais, Saint Cyr sous Dourdan (FR)

(73) Assignee: ATWARE, Saint Cyr sous Dourdan (FR)

( * ) Notice: Subject to any disclaimer, the term of this patent is extended or adjusted under 35 U.S.C. 154(b) by 149 days.

(21) Appl. No.: 15/738,720

(22) PCT Filed: Jun. 10, 2016

(86) PCT No.: PCT/FR2016/051397
§ 371 (c)(1),
(2) Date: Dec. 21, 2017

(87) PCT Pub. No.: WO2016/207508
PCT Pub. Date: Dec. 29, 2016

(65) Prior Publication Data
US 2018/0196087 A1  Jul. 12, 2018

(30) Foreign Application Priority Data
Jun. 26, 2015 (FR) ..................... 15 55928

(51) Int. Cl.
*G01R 15/18* (2006.01)
*G01R 33/04* (2006.01)

(52) U.S. Cl.
CPC .......... *G01R 15/186* (2013.01); *G01R 33/04* (2013.01)

(58) Field of Classification Search
None
See application file for complete search history.

(56) References Cited

U.S. PATENT DOCUMENTS

| | | | |
|---|---|---|---|
| 2009/0143665 A1 | 6/2009 | Seki et al. | |
| 2014/0253113 A1 | 9/2014 | Suzuki | |
| 2015/0108974 A1 | 4/2015 | Kennedy et al. | |
| 2018/0188206 A1* | 7/2018 | Augais ................. | G01N 27/745 |

OTHER PUBLICATIONS

Eric Vourc H et al.: "Neel Effect Toroidal Current Sensor", IEEE Transactions on Magnetics, IEEE, service Center, New York, NY, US, vol. 49, No. 1, Jan. 1, 2013, pp. 81-84 XP011483180, Abstract; figures 2-4 Section.
International Search Report, dated Aug. 22, 2016, from corresponding PCT/FR2016/051397 application.

* cited by examiner

*Primary Examiner* — Jermele M Hollington
*Assistant Examiner* — Suresh K Rajaputra
(74) *Attorney, Agent, or Firm* — Young & Thompson

(57) ABSTRACT

A device for measuring a magnetic material includes four coils having cores made of a superparamagnetic material, and a unit for injecting, into the coils, a direct current and two alternating currents of different frequencies. The value of the magnetic field is derived from the value of the direct current required to cancel an amplitude of a component at a mixing frequency. A structure of the electrical connections to the coils reduces disturbances caused by the alternating currents used with respect to the detection of the component at the mixing frequency. Moreover, specific configurations of the coils reduce the influence of stray electromagnetic radiation on the measurement results. The device can also be used to measure direct currents.

20 Claims, 4 Drawing Sheets

DEVICE FOR MEASURING A MAGNETIC FIELD

The present invention relates to a device for measuring a magnetic field, as well as methods that use such device for measuring a magnetic field or a direct current.

Numerous applications require measurement of a magnetic field, either because the value of the magnetic field is sought in itself, or because it gives access to the value of another physical quantity that is sought. In particular, it is known that the value of a direct current can be deduced from a measurement of the magnetic field that is generated by this direct current.

However, there is still a significant need for improved magnetic field measuring devices, particularly regarding the following criteria:
- the device allows for accurate and reliable measurements;
- the device can be produced at a low cost;
- the device generates low energy consumption for each measurement;
- the results of the measurements that are taken with the device are not affected or are only slightly affected by involuntary signal offsets;
- the measurements that are taken with the device have a high signal-to-noise ratio;
- the device produces measurement results that are robust relative to external electromagnetic interference; and
- the device must meet the regulatory electromagnetic compatibility (EMC) requirements.

To improve these criteria with respect to existing devices, a first aspect of the present invention proposes a novel device for measuring a magnetic field, which comprises:
- four coils of electric wire with superparamagnetic cores, the four cored coils having identical or substantially identical geometries and electrical and electromagnetic properties, and the four coils being electrically connected in series so as to form a chain with two end terminals of the chain, a central terminal in the chain, and two secondary terminals of the chain that are each located between the central terminal and one of the two end terminals;
- means for injecting a direct current into the chain of coils, which are connected to the two end terminals of the chain of coils, and means for adjusting an intensity of the direct current;
- means for injecting a first alternating current having a first frequency, which are connected in order to inject the first alternating current into the chain of coils via the central terminal, and to recover this first alternating current via the two end terminals, so that the first alternating current flows with first intensities that are identical or substantially identical via the two end terminals without flowing via the secondary terminals;
- means for injecting a second alternating current having a second frequency different from the first frequency, these means of injecting the second alternating current being connected in order to inject the second alternating current into the chain of coils via the two secondary terminals, and to recover the second alternating current via the central terminal and the two end terminals so that the second alternating current flows with second intensities that are identical or substantially identical via the two secondary terminals, and flows with third intensities that are identical or substantially identical in all of the coils but in opposite directions between two coils that are successive in the chain; and
- means for detecting at least one voltage component that exists between both secondary terminals of the chain of coils, a frequency of this voltage component, called mixing frequency, being a linear combination of the first frequency and the second frequency, with linear combination coefficients that are fixed non-zero integers.

The device of the invention is suitable for simultaneously activating the means for injecting the first and second alternating currents, and for adjusting the intensity of the direct current so as to cancel an amplitude of the voltage component that has the mixing frequency, while the first and second alternating currents are injected. Thus, when the four coils are placed in the magnetic field, a value of the intensity of the direct current that cancels the amplitude of the voltage component having the mixing frequency is proportional to an intensity of the magnetic field.

In the context of the invention, by "superparamagnetic material" is meant a non-linear magnetic material that is devoid of hysteresis when the magnetic excitation, or magnetic field, that is applied to the material is varied periodically.

In the device of the invention, the superparamagnetic material of the cores is used as a sensor for a total permanent magnetic field that is not zero inside the coils. This total permanent magnetic field is the sum of the magnetic field to be measured, which is assumed to be permanent, or static, and a compensating magnetic field that is produced by the direct current injected into the coils. The superparamagnetic material exhibits non-linear behaviour with respect to the first and second alternating currents once the total permanent magnetic field is non-zero, whereas this behaviour becomes substantially linear if the total permanent magnetic field is zero. As a result, the nullity of the total permanent magnetic field is detected by the detection means, via the nullity of the voltage component at the mixing frequency. When the relation between the direct current that is injected into the coils and the compensating magnetic field that is produced by this direct current is known, by calibration or calculation, the value of this direct current that produces the cancellation of the voltage component at the mixing frequency provides a value for the magnetic field to be measured. But another way, the device of the invention implements a compensation measurement principle, for which the nullity of the voltage component at the mixing frequency constitutes an exact compensation indicator.

Such device can be produced using electrical components that are commercially available at low cost, particularly because they are already produced in large quantities for other applications.

The connection of the direct current injection means to the coils, those of the first and second alternating current injection means as well as the detection means reduce or suppress, by their connection direction, contributions to the signal that is transmitted to the detection means which would be due to the first and second alternating currents. This makes the detection of the voltage component at the mixing frequency more accurate and reliable.

In addition, the means for injecting the currents can easily be selected or designed to ensure electromagnetic compatibility.

Furthermore, a quotient between the first and second frequencies may preferably be greater than 10, so that the means for detecting the voltage component at the mixing frequency isolate this component more efficiently.

In preferred embodiments of a device according to the invention, the direct current injection means, first alternating current injection means and second alternating current injection means may comprise together four connecting cables that are respectively dedicated to each of the four coils. Each of the cables comprises two electrical wires that are connected one-by-one to the two successive terminals in the chain of coils that directly connect the coil to which this cable is dedicated. Thus, all of the direct current, all of the first alternating current and all of the second alternating current that are injected into the coils are carried out and back by the four cables. The respective lengths of the four cables can then be adjusted so that the third intensities of the second alternating current are identical or substantially identical in absolute value in all of the coils of the chain. Moreover, the transfer of electrical energy to the coils, from the means for injecting the alternating current that has the highest frequency, can be improved in this way. For identical measurement sensitivity, the energy consumption of the device can thus be reduced.

Furthermore, when the second frequency is higher than the first frequency, the means for injecting the second alternating current may comprise a source of the second alternating current and a primary winding of a transformer, with a current output of the source that is connected to a middle point of the primary winding of the transformer. In this case, the two end terminals of the primary winding are connected respectively to the two secondary terminals of the chain of coils, and a secondary winding of the transformer belongs to the means for detecting the voltage component that has the mixing frequency. In such an embodiment, the voltage that is transmitted to the detection means has, by design of the device, components at the first and second frequencies that have zero amplitudes. For this reason, the device of the invention can be said to be self-compensated with reference to potential contributions from the excitation signals to the first and second frequencies in the signal that is detected. The component of the mixing frequency can thus be isolated with greater efficiency and purity.

In particular, in order to obtain a signal-to-noise ratio that is higher, the means for detecting the voltage component that has the mixing frequency, in a device according to the invention, may comprise:
  a first synchronous demodulator that is coupled to the means for injecting the second alternating current, and which is arranged in order to offset the frequency of the voltage component that has the mixing frequency, by suppressing a contribution of the second frequency to this mixing frequency; and
  a second synchronous demodulator that is coupled to the means for injecting the first alternating current, and which is arranged in order to offset the frequency of the voltage component that has the mixing frequency, by suppressing a contribution of the first frequency to this mixing frequency.

In such case, these first and second synchronous demodulators are arranged in cascade in order to output a direct electrical signal that is proportional to an amplitude of the voltage component that has the mixing frequency. This signal constitutes the detection signal, after optional amplification. Moreover, when the second frequency is higher than the first frequency, the means for injecting the second alternating current may comprise means for multiplying an instantaneous intensity of the second alternating current by a pseudo-random sequence of factors each equal to +1 or −1, so as to create a modulation of the second alternating current that is also suppressed by the first synchronous demodulator. The signal-to-noise ratio of the device can be further increased in this way.

Optionally, to further increase the sensitivity of the detection means, they may be adapted for detecting a combination of two components of the alternating voltage that exists between both secondary terminals of the chain of coils, corresponding to two separate mixing frequencies. However, in such a case, these two components have opposite contributions for the lowest one among the first and second frequencies in the linear combinations that constitute both mixing frequencies, and identical contributions for the highest one of the first and second frequencies.

Generally, when the second frequency is higher than the first frequency, the means for injecting the first alternating current may be connected to the central terminal of the chain of coils by a first capacitor that is suitable for conducting alternating current at the first frequency and at the second frequency. Simultaneously, the means for injecting the second alternating current may be connected to each of the two secondary terminals of the chain of coils by a respective second capacitor that is suitable for conducting alternating current at the second frequency but not at the first frequency. Such embodiment of the device contributes to ensuring the desired distribution for the direct current, the first alternating current and the second alternating current in the four coils.

The arrangement of the four coils in relation to each other, as well as their respective winding directions of the electrical wire, may advantageously be adapted to the geometry and symmetries of the magnetic field to be measured. Thus, the sensitivity of the device to the magnetic field to be measured can be improved, while its sensitivity to stray magnetic fields that are not related to the magnetic field to be measured can be reduced.

A second aspect of the invention proposes a method for measuring a magnetic field that comprises the following steps:
  /1/ placing the four coils of a device according to the first aspect of the invention in a magnetic field; and
  /2/ simultaneously activating the means for injecting the first and second alternating currents, and adjusting the intensity of the direct current that is produced by the means for injecting the direct current so as to cancel the amplitude of the voltage component that has the mixing frequency, while the first and second alternating currents are injected.

In such case, the value of the intensity of the direct current that is produced by the direct current injection means, which was adjusted in step /2/, constitutes a measurement result for the magnetic field.

A third aspect of the invention proposes a method for measuring a direct electrical current that comprises the following steps:
  /1/ providing a device according to the first aspect of the invention;
  /2/ arranging the four coils near the direct electrical current to be measured, called the unknown current, or around this unknown current so that this unknown current passes through the loops of the four cores outside the coils; and
  /3/ simultaneously activating the means for injecting the first and second alternating currents, and adjusting the intensity of the direct current that is produced by the means for injecting the direct current into the chain of coils so as to cancel the amplitude of the voltage component that has the mixing frequency, while the first and second alternating currents are injected.

In this case, the value of the intensity of the direct current that is produced by the direct current injection means, which was adjusted in step /3/, constitutes a measurement result for the unknown current.

Further features and advantages of the present invention will become apparent from the following description of non-limitative embodiments, with reference to the attached drawings, in which.

Figure 2:
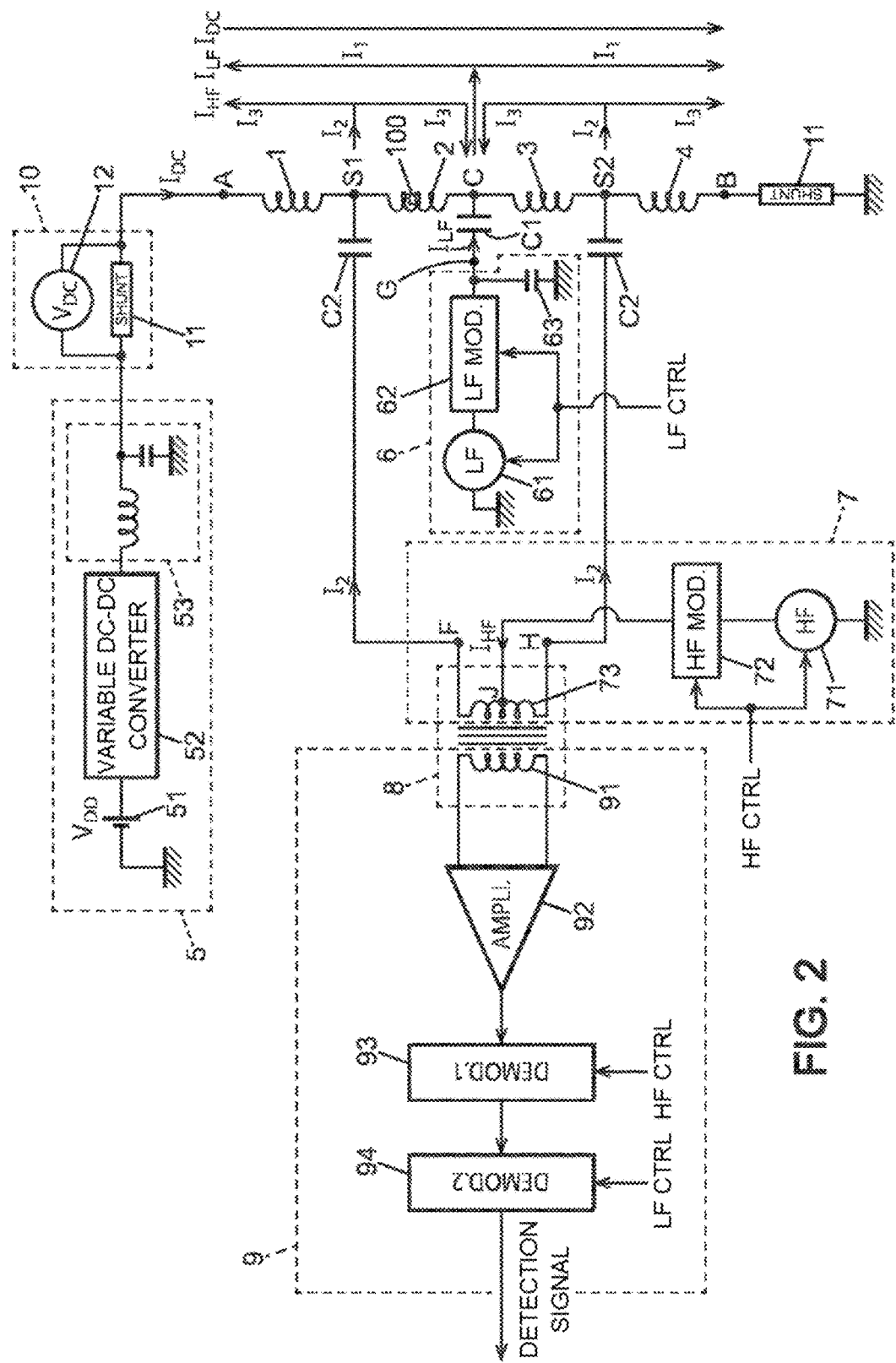
FIG. 2 is an overview diagram of a device according to the invention.
Figure 3:
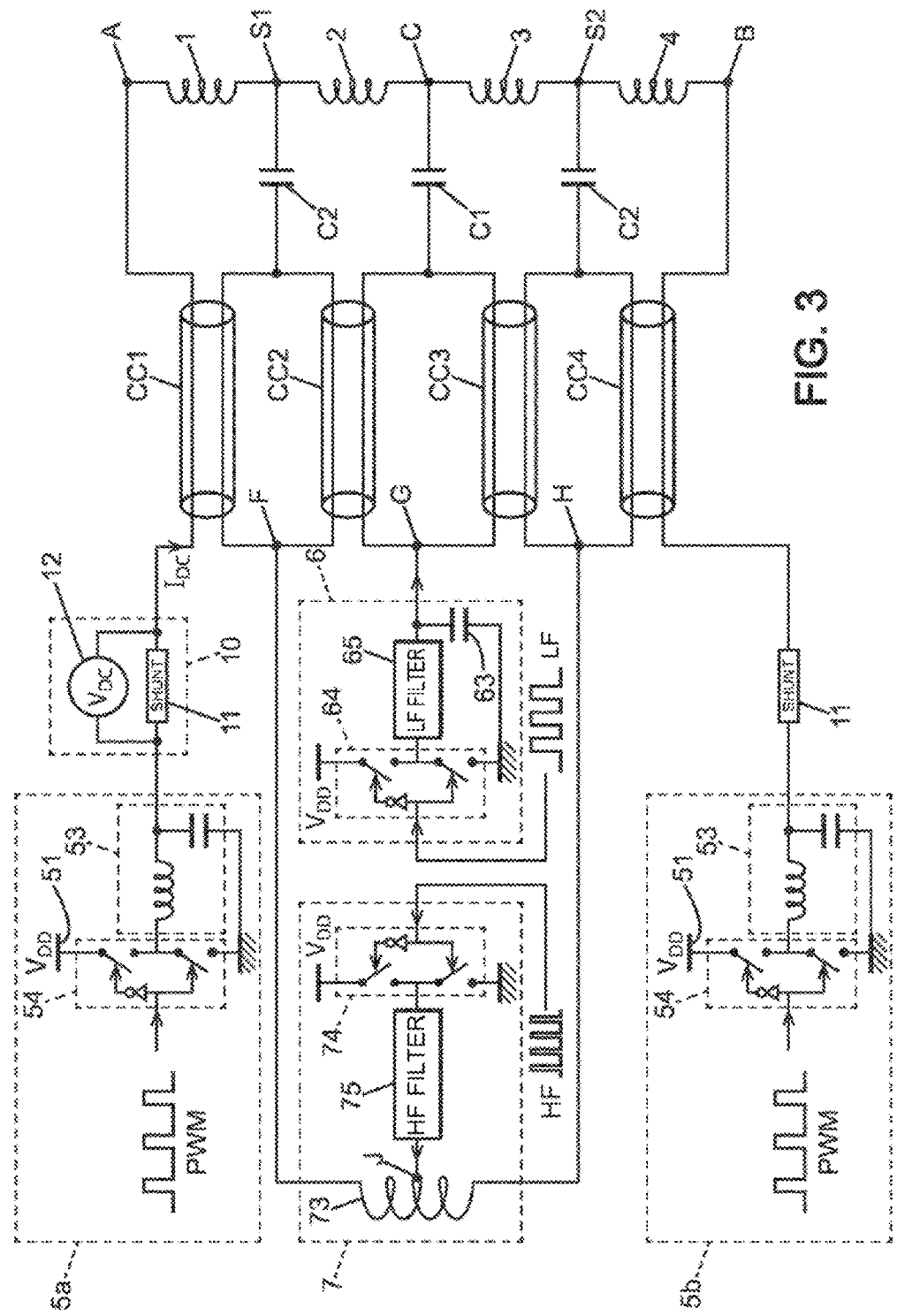

FIG. 3 corresponds to FIG. 2 for specific embodiments of the means for injecting the currents.

Figure 1A:
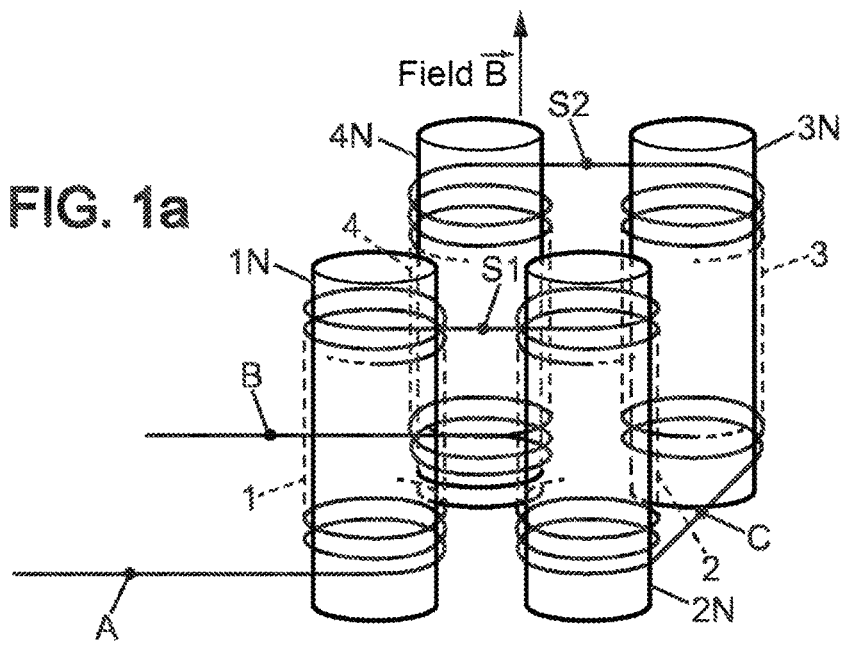
FIGS. 1a, 1b and 1c are perspective views of three possible configurations of the four coils of a device according to the invention.
Figure 1B:
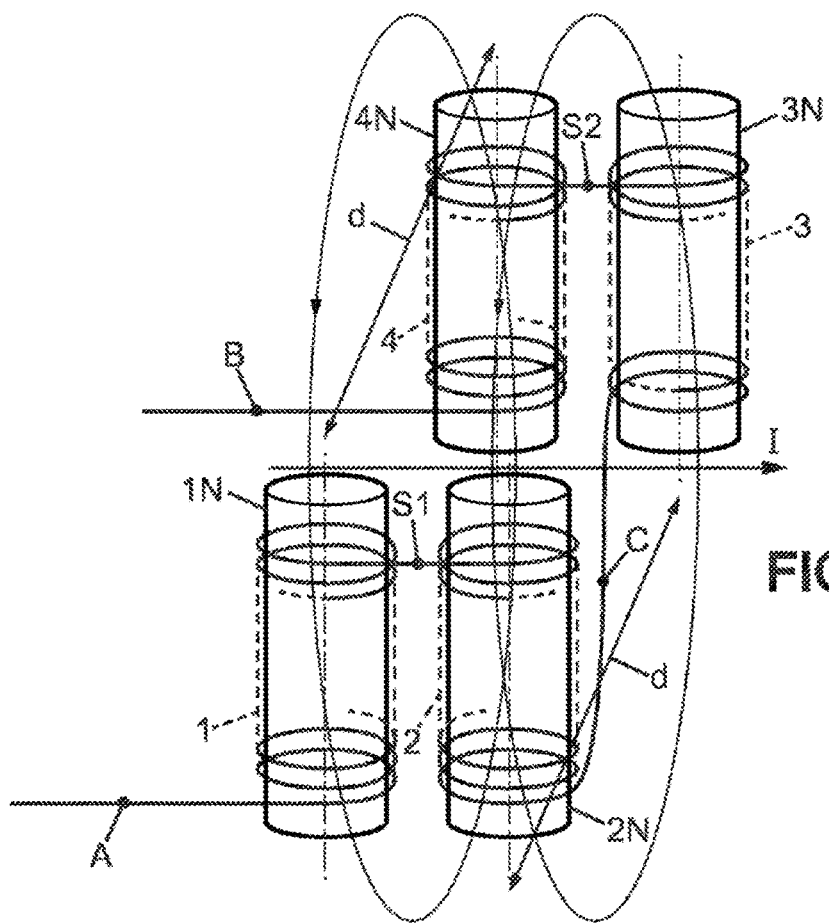
Figure 1C:
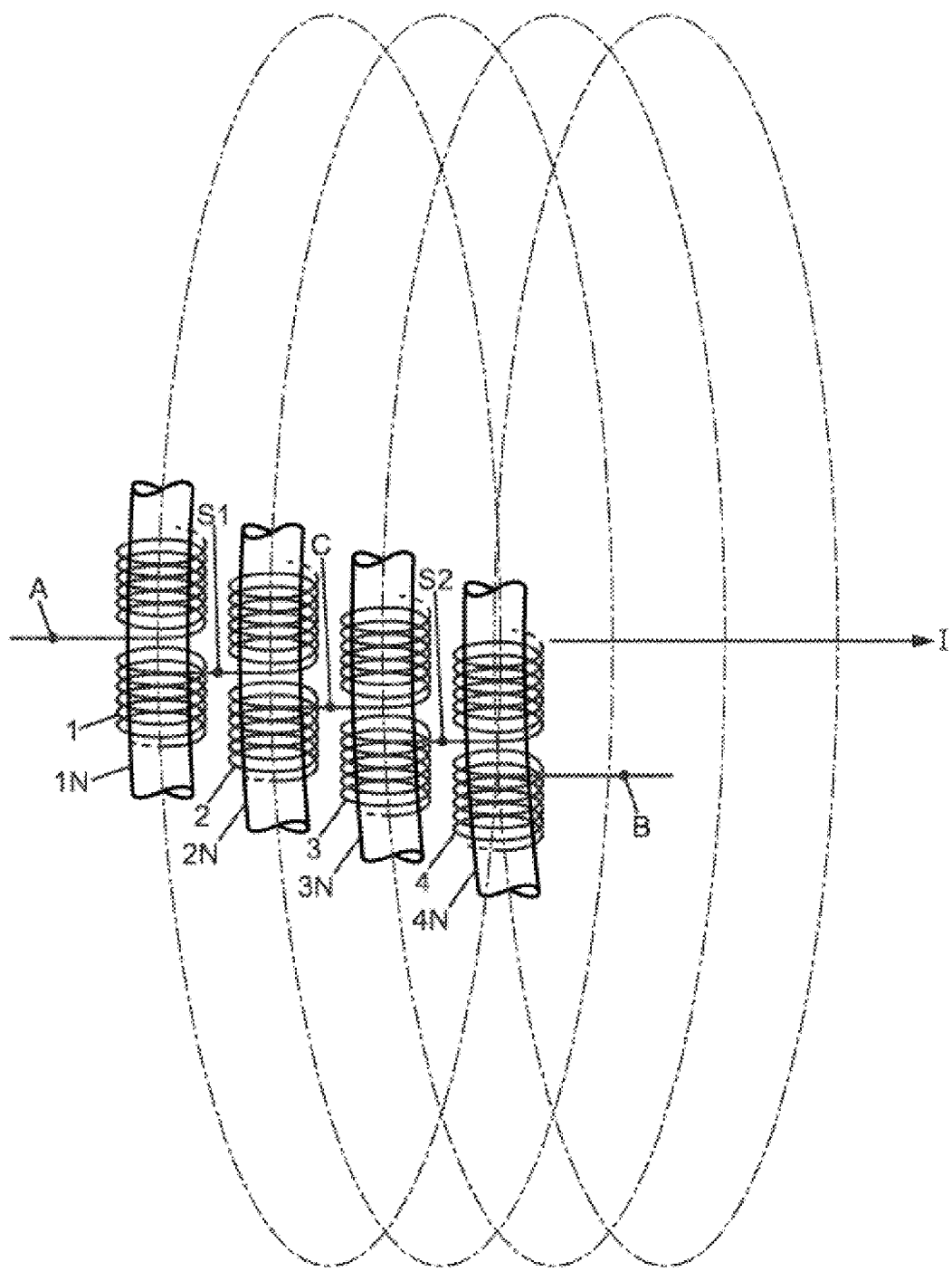

For the purpose of clarity of FIGS. 1a-1c, the apparent dimensions of the components shown do not correspond to actual dimensions or actual dimension ratios. Furthermore, identical references indicated on different figures denote identical components or components with identical functions.

In FIGS. 1a-1c, references 1 to 4 denote four coils of electrical wire that are designed to be identical. References 1N to 4N denote four cores of superparamagnetic material that are designed to be identical, and are each placed in one of the coils 1 to 4 in a same way for all of the coils.

The coils 1 to 4 are electrically connected in series. A and B respectively denote the end terminals of the series connection of the coils 1-4, terminal A being on the side of coil 1 and terminal B being on the side of coil 4. S1 and S2, called secondary terminals, are respectively located between the coils 1 and 2 and between the coils 3 and 4, and C, called the central terminal, is located between coils 2 and 3.

In the configuration in FIG. 1a, the four coils 1-4 are all parallel to a common axis, which is vertical in the figure. They are juxtaposed to one another and have respective winding directions of the electrical wire around the cores N1-N4 that are identical with reference to the common axis. This first configuration is suitable for measuring a magnetic field that is substantially uniform in the portion of space occupied by the four cored coils. The magnetic field to be measured is denoted Field B in FIG. 1a. In order to measure it, all of the four cored coils must be brought into the zone of the magnetic field and oriented so that the common axis of the coils 1-4 and the cores N1-N4 are parallel to the magnetic field to be measured.

In the configuration in FIG. 1b, the four coils 1-4 are again all parallel to a common axis, which is vertical in the figure. However, they are split into two pairs of coils, with the coils in one and same pair having a winding direction of the electrical wire around the cores that is identical for both coils in that pair, and opposite to the winding direction of the coils in the other pair. Moreover, the coils in a same pair are juxtaposed whereas the two pairs of coils are apart from each other perpendicular to the common axis. In FIG. 1b, the coils 1 and 2 together constitute the first pair and coils 3 and 4 together constitute the second pair, with d being the distance separating the two pairs. This second configuration is suitable for measuring a magnetic field that is reversed, but with equal modulus, between the location of the first pair and the location of the second pair. It is particularly suitable for measuring the magnetic field that is produced by an electrical current denoted I, the path of which is straight and centred between the two pairs of coils, perpendicular to the common axis of the coils and also to the direction of separation of the two pairs of coils. The ellipses drawn on FIG. 1b are field lines of the magnetic field B that is created by the current I. These field lines are circles in space, with circle axis which is the path of the current I, and appear as ellipses in a perspective view. Such a configuration makes it possible to compensate between the two pairs of coils for the stray voltages that are induced by external electromagnetic radiation. Obviously, the configuration in FIG. 1b may be modified by equivalence by sliding one of the pairs along the magnetic field lines, so that the coils of this pair remain parallel to the field lines at the location of the pair.

In the configuration in FIG. 1c, each core 1N-4N is in the form of a closed loop and each coil 1-4 is wound around the core of this coil perpendicular to a longitudinal direction of the loop. Moreover, the four cored coils are juxtaposed to one another over the entire length of the core loops, and have identical electrical wire winding directions. This third configuration is suitable for measuring magnetic fields that have similar distributions to the one described above with reference to FIG. 1b. In particular, it is suitable for measuring the magnetic field that is created by a current I having a path which overlays the axis of the loops constituted by the cores. This third configuration ensures that external electromagnetic radiation has almost no influence on the measurement results provided by the device of the invention.

The designations used in the general part of the present description have the following correspondences with those used for the embodiment in FIGS. 2 and 3: the first frequency may be equal to 1 kHz for example and is denoted LF, and the second frequency may be equal to 200 kHz and is denoted HF. These values of the LF and HF frequencies make it possible to use filters that are commercially available, particularly for radio applications. The first and second alternating currents, which respectively have the frequencies LF and HF, are denoted $I_{LF}$ and $I_{HF}$. The direct current is denoted $I_{DC}$.

The following references, which appear in FIG. 2, have the meanings given below:
- 5 generator of the direct current $I_{DC}$, called direct current injection means;
- 6 generator of the current $I_{LF}$, called first alternating current injection means;
- 7 generator of the current $I_{HF}$, called second alternating current injection means;
- 8 transformer, with a primary winding with reference 73 and a secondary winding with reference 91;
- 9 means for detecting an alternating voltage component that exists between the secondary terminals S1 and S2, with a mixing frequency that is a linear combination of the frequencies LF and HF;
- 10 direct current measuring means;
- 11 electrical resistors equal to one other, denoted SHUNT;
- 12 means for measuring the voltage at the terminals of the electrical resistor 5, such as a direct current voltmeter denoted $V_{DC}$;
- C1 capacitor sized to transmit the current $I_{LF}$, and which also transmits a current at the frequency HF as a result; and
- C2 capacitors sized to transmit currents at the frequency HF, but to prevent currents at the frequency LF from passing through.

The generator 5 may be made up of a direct voltage source 51, a variable DC-DC converter 52 and a filter 53. $V_{DD}$ is the direct voltage produced by the source 51. The converter 52 can be controlled by an operator to adjust the value of the intensity of the current $I_{DC}$. The filter 53 ensures that the currents at the frequencies LF and HF can flow outside the coils 1-4 via the end terminal A. The generator 5 therefore produces the current $I_{DC}$ with an intensity value that can be adjusted as required.

The resistor 11 and the voltmeter 12 together constitute the means 10 for measuring the intensity $I_{DC}$. These means 10 are advantageously inserted in series between the output of the generator 5 and terminal A of the chain of coils 1-4. The two resistors 11 arranged symmetrically at the terminals A and B ensure that the alternating currents are balanced in the four coils 1-4.

The generator 6 may be made up of a source of alternating current at the frequency LF, with reference 61, and optionally a modulator 62, denoted LF MOD. When used, the modulator 62 is connected in series to the output of the source 61. LF CTRL denotes a control signal or a source signal of the generator 6. The output of the source 61, or the modulator 62, is connected to the central terminal C by means of the capacitor C1. The capacitor 63 ensures that a current at the frequency HF can flow outside the coils 1-4 via terminal C. The generator 6 produces the current $I_{LF}$.

The generator 7 may be made up of a source of alternating current at the frequency HF, with reference 71, optionally a modulator 72, denoted HF MOD., and the primary winding 73 of the transformer 8. When used, the modulator 72 is connected in series to the output of the source 71. HF CTRL denotes a control signal or a source signal of the generator 7. The output of the source 71, or the modulator 72, is connected to a middle point J of the primary winding 73 of the transformer 8. The end terminals F and H of the primary winding 73 are connected to the secondary terminals S1 and S2 of the chain of coils 1-4, respectively, by means of the capacitors C2. The generator 7 produces the current $I_{HF}$.

Thanks to these connections, the direct current $I_{DC}$, a portion $I_1$ of the intensity of the current $I_{LF}$ and also a portion $I_3$ of the intensity of the current $I_{HF}$ pass through each of the four coils 1-4, with the current orientations shown in the right-hand part of FIG. 2. Moreover, the portions of intensities $I_1$ and $I_3$ of the two alternating currents are: $I_1=I_{LF}/2$ and $I_3=I_{HF}/4$. In addition, the current $I_{HF}$ is injected into the chain of coils 1-4 with an intensity $I_2=I_{HF}/2$ by each of the secondary terminals S1 and S2.

The detection means 9 comprise the secondary winding 91 of the transformer 8, an amplifier 92, denoted AMPLI., a first synchronous demodulator 93, denoted DEMOD. 1 and a second synchronous demodulator 94, denoted DEMOD. 2.

The synchronous demodulator 93 receives as an input the voltage that exists at the terminals of the secondary winding 91, after amplification of this voltage, and simultaneously receives the HF CTRL signal that is introduced into the generator 7. It is suitable for carrying out a frequency transfer on the component of the voltage in the secondary winding 91 that has the frequency HF−LF, and advantageously also on the component of the same voltage that has the frequency HF+LF. Preferably, the synchronous demodulator 93 can be of the analogue type. When the modulator 72 is used, the modulation of the current $I_{HF}$ that is produced by this modulator 72 is automatically taken into account by the synchronous demodulator 93. For example, this modulation of the current $I_{HF}$ can consist of reversing the direction of the current $I_{HF}$ repeatedly, according to a random or pseudo-random time sequence. Such current reversals result in multiplying the current $I_{HF}$ by successive factors each equal to +1 or −1 for variable durations, and produce a spectrum spread of the current $I_{HF}$ as this current is delivered by the generator 7.

Advantageously, the signal that is produced as an output by the synchronous demodulator 93 can be amplified before it is introduced into the synchronous demodulator 94.

The synchronous demodulator 94 therefore receives as an input the signal produced by the synchronous demodulator 93, after optional amplification, and simultaneously receives the LF CTRL signal that is introduced into the generator 6. It is suitable for carrying out a frequency transfer on the signal produced by the synchronous demodulator 93. Preferably, the synchronous demodulator 94 can be of the digital type. When the modulator 62 is used, the modulation of the current $I_{LF}$ that is produced by this modulator 62 is automatically taken into account by the synchronous demodulator 94.

In this way, the detection means 9 produce as an output a direct voltage that is proportional to the amplitude of the component at the frequency HF−LF, contained in the voltage that exists between the secondary terminals S1 and S2. This component at the frequency HF−LF results from the non-linear behaviour of the superparamagnetic material of the sample 100. Due to this non-linear behaviour, the response of the superparamagnetic material of the cores 1N-4N to the simultaneous excitations according to the two frequencies HF and LF contains signals at frequencies that are linear combinations of the two frequencies HF and LF, with linear combination coefficients that are integers. In the present case, the synchronous demodulators 93 and 94 select the combination that is the difference HF−LF. The amplitude of the component at this frequency HF−LF constitutes the detection signal, and can be evaluated by a voltmeter.

FIG. 3 shows possible embodiments of the generators 5-7 that are particularly cost-effective, and a way of connecting them to the coils 1-4 that makes it possible to improve the energy transfer from the generators 5-7 to the coils 1-4.

The direct current generator 5 may be made up of two generators 5a and 5b that are identical but connected respectively to the terminals A and B so as to be able to inject the direct current $I_{DC}$ into the chain of coils from terminal A towards terminal B or in the opposite direction. Only one of the two generators 5a and 5b is therefore activated for each measurement, depending on the desired sign for the current $I_{DC}$. Each generator 5a, 5b comprises two commutators that are connected in series between the two terminals ($V_{DD}$ and earth) of the source 51. Such an assembly, denoted by the reference 54, is commonly known as a "bridge arm" by a person skilled in the art. It is intended for a chopping function. The intermediate terminal between the two commutators of each generator 5a, 5b is connected to the output of this generator by means of the filter 53. The control of the commutators by pulse width modulation (PWM) makes it possible to adjust the absolute value of the direct current intensity $I_{DC}$. The means 10 for measuring the current $I_{DC}$ are advantageously inserted in series between the output of the generator 5a and terminal A of the chain of coils 1-4, and the other resistor 11 may be inserted in series between the output of the generator 5b and terminal B of the chain of coils 1-4.

The alternating current generator 6 may also be produced using a bridge arm, reference 64, and a suitable filter 65. The bridge arm of the generator 6 may also be powered by the source 51, and its two commutators are controlled alternately at the frequency LF. The filter 65, denoted LF filter, selects the fundamental component for output transmission to the central terminal C.

Finally, the alternating current generator 7 may also be produced using a bridge arm, reference 74, and a suitable filter 75. The bridge arm of the generator 7 may equally be powered by the source 51, and its two commutators are controlled alternately at the frequency HF. The filter 75 selects a spectral interval around the fundamental component for output transmission to the secondary terminals S1 and S2. In a known manner, such a composition of the generator 7 makes it possible to simply carry out spectrum spread modulation, by offsetting the control pulses of the bridge arm by a half-period according to a random time sequence.

The outputs of the generators 5a, 5b and 6, together with the two end terminals F and H of the primary winding 73 of the transformer 8, may be connected to the terminals A, B, C and S1, S2 by four two-wire cables CC1-CC4. The four cables CC1-CC4 are advantageously of one and the same type, two-wire or coaxial, preferably shielded and with controlled characteristic impedance. They are connected in the following manner:

the first wire of the cable CC1 connects the output of the generator 5a to terminal A of the chain of coils 1-4;

the second wire of the cable CC1 and the first wire of the cable CC2 are connected in parallel in order to connect the end terminal F of the primary winding of the transformer 8 to the secondary terminal S1 of the chain of coils 1-4, by means of the first capacitor C2, the second wire of the cable CC2 and the first wire of the cable CC3 are connected in parallel in order to connect the output G of the generator 6 to the central terminal C of the chain of coils 1-4, by means of the capacitor C1, the second wire of the cable CC3 and the first wire of the cable CC4 are connected in parallel in order to connect the end terminal H of the primary winding of the transformer 8 to the secondary terminal S2 of the chain of coils 1-4, by means of the second capacitor C2, and the second wire of the cable CC4 connects the output of the generator 5b to terminal B of the chain of coils 1-4.

The respective lengths of the cables CC1-CC4 can then be advantageously selected in order to adjust the connection impedances that are effective for the alternating current $I_{HF}$. Thus, it is possible to increase the electrical energy that is transferred by the generator 7 to the coils 1-4 for equivalent consumption of the device.

A device according to the invention that has for example the coil configuration in FIG. 1a can be used in the following way to measure the magnetic field B. All of the four coils 1-4 are placed in the magnetic field to be measured, preferably with the common axis of the coils parallel to the magnetic field. In the absence of direct current $I_{DC}$ ($I_{DC}=0$), the two alternating currents $I_{LF}$ and $I_{HF}$ generate a non-zero detection signal at the output of the synchronous demodulator 94. The direct current intensity $I_{DC}$ is then adjusted by means of the variable converter 52 to cancel this detection signal. Optionally, this adjustment can be automated by making the control of the converter 52 dependent on the output of the synchronous demodulator 94. The value of the direct current intensity $I_{DC}$ that produces the cancelling of the detection signal is the magnetic field measurement result. It may optionally be converted into magnetic field units if the numerical relation between the intensity of the compensating magnetic field that is produced by the coils 1-4 and the direct current intensity $I_{DC}$ is known.

However, a device according to the invention can also be used in order to measure a direct current I that is unknown. In this case, the unknown current I is measured by means of the magnetic field that it generates. This magnetic field is measured as described above, and the value of the unknown current is deduced from the value that has been measured for the magnetic field, knowing the path of the unknown current I and the positions of the coils 1-4 relative to this path. A person skilled in the art, particularly skilled in magnetostatics, knows how to link the value measured for the magnetic field to the value of the intensity of the unknown current I. Advantageously, the coils 1-4 are arranged relative to the trajectory of the unknown current I in a manner that is suited to the shape of the magnetic field lines, and so that there is a simple numerical relation between the value of the unknown current I and the value of the measured magnetic field. The configurations in FIGS. 1b and 1c are particularly suitable for this.

It is understood that the invention can be reproduced by modifying secondary aspects thereof with respect to the detailed description provided above, while retaining at least some of the advantages cited. These modifications can include, but are not limited to:

the relative positions and orientations of the four coils 1-4 can be changed;

the use of the modulators 62 and 72 can be combined with the embodiment of the generators 6 and 7 using bridge arms;

the generators 5, 6 and 7 can have compositions different from those described with reference to FIGS. 2 and 3; and the mixture of frequencies that is selected by the detection means 9 in order to obtain the measurement signal can be a linear combination of the frequencies LF and HF other than the difference HF−LF and the sum HF+LF.

The invention claimed is:

1. Device for measuring a magnetic field, comprising:

four coils (1-4) of electrical wire with non-linear magnetic cores devoid of hysteresis, called superparamagnetic cores (1N-4N), the four cored coils having identical or substantially identical geometries and electrical and electromagnetic properties, and being electrically connected in series so as to form a chain with two end terminals (A, B) of said chain, a central terminal (C) in said chain, and two secondary terminals (S1, S2) of said chain that are each located between the central terminal and one of the two end terminals;

means (5) for injecting a direct current ($I_{DC}$) into the chain of coils, connected to the two end terminals (A, B) of the chain of coils (1-4), and means for adjusting an intensity of the direct current;

means (6) for injecting a first alternating current ($I_{LF}$) having a first frequency (LF), connected in order to inject said first alternating current into the chain of coils (1-4) via the central terminal (C), and to recover said first alternating current via the two end terminals (A, B), so that the first alternating current flows with first intensities that are identical or substantially identical via said two end terminals without flowing via the secondary terminals (S1, S2);

means (7) for injecting a second alternating current ($I_H$) having a second frequency (HF) different from the first frequency (LF), connected in order to inject said second alternating current into the chain of coils (1-4) via the two secondary terminals (S1, S2), and to recover said second alternating current via the central terminal (C) and the two end terminals (A, B) so that the second alternating current flows with second intensities that are identical or substantially identical via the two secondary terminals, and in such a way that said second alternating current flows with third intensities that are identical or substantially identical in all of the coils but in opposite directions between two coils that are successive in the chain; and means (9) for detecting at least one voltage component that exists between both secondary terminals (S1, S2) of the chain of coils (1-4), a frequency of said voltage component, called mixing frequency, being a linear combination of the first frequency (LF) and the second frequency (HF), with linear combination coefficients that are fixed non-zero integers, said device being suitable for simultaneously activating the means (6, 7) for injecting the first ($I_{LF}$) and second ($I_{HF}$) alternating currents, and for adjusting the intensity of the direct current ($I_{DC}$) so as to cancel an amplitude of the voltage component that has the mixing frequency, while said first and second alternating currents are injected, so that when the four coils (1-4) are placed in the magnetic field, a value of the intensity of the direct current ($I_{DC}$) that cancels the amplitude of the voltage component having the mixing frequency is proportional to an intensity of the magnetic field.

2. Device according to claim 1, wherein a quotient between the first (LF) and second (HF) frequencies is greater than 10.

3. Device according to claim 2, wherein the means (5) for injecting the direct current ($I_{DC}$), the means (6) for injecting the first alternating current ($I_{LF}$) and the means (7) for injecting the second alternating current ($I_{HF}$) together comprise four connection cables (CC1-CC4) that are respectively dedicated to each of the four coils (1-4), each cable comprising two electrical wires connected one-by-one to the two successive terminals in the chain of coils that directly connect the coil to which said cable is dedicated, so that all of the direct current ($I_{DC}$), all of the first alternating current ($I_{LF}$) and all of the second alternating current ($I_{HF}$) that are injected into the coils (1-4) are transported out and back by said cables, and respective lengths of said cables are adjusted so that the third intensities of the second alternating current are identical or substantially identical in absolute values in all of the coils in the chain.

4. Device according to claim 2, wherein the second frequency (HF) is higher than the first frequency (LF), and wherein the means (7) for injecting the second alternating current ($I_{HF}$) comprise a source (71) of the second alternating current and a primary winding (73) of a transformer (8), a current output of said source being connected to a middle point (J) of the primary winding of the transformer, and two end terminals (F, H) of said primary winding being connected respectively to the two secondary terminals (S1, S2) of the chain of coils (1-4), and wherein a secondary winding (91) of the transformer (8) belongs to the means (9) for detecting the voltage component that has the mixing frequency.

5. Device according to claim 2, wherein the means (9) for detecting the voltage component that has the mixing frequency comprise:

a first synchronous demodulator (93) that is coupled to the means (7) for injecting the second alternating current ($I_{HF}$), and which is arranged to offset the frequency of the voltage component that has the mixing frequency, by suppressing a contribution of the second frequency (HF) to said mixing frequency; and a second synchronous demodulator (94) that is coupled to the means (6) for injecting the first alternating current ($I_{LF}$), and which is arranged to offset the frequency of the voltage component that has the mixing frequency, by suppressing a contribution of the first frequency (LF) to said mixing frequency, said first (93) and second (94) synchronous demodulators being arranged in cascade so as to output a direct electrical signal output that is proportional to the amplitude of the voltage component that has the mixing frequency.

6. Device according to claim 2, wherein the second frequency (HF) is higher than the first frequency (LF), and the means (6) for injecting the first alternating current ($I_{LF}$) are connected to the central terminal (C) of the chain of coils (1-4) by a first capacitor (C1) that is suitable for conducting alternating current at the first frequency (LF) and at the second frequency (HF);

and the means (7) for injecting the second alternating current ($I_{HF}$) are connected to each of both secondary terminals (S1, S2) of the chain of coils (1-4) by a respective second capacitor (C2) that is suitable for conducting alternating current at the second frequency (HF) but not at the first frequency (LF).

7. Device according to claim 1, wherein the means (5) for injecting the direct current ($I_{DC}$), the means (6) for injecting the first alternating current ($I_{LF}$) and the means (7) for injecting the second alternating current ($I_{HF}$) together comprise four connection cables (CC1-CC4) that are respectively dedicated to each of the four coils (1-4), each cable comprising two electrical wires connected one-by-one to the two successive terminals in the chain of coils that directly connect the coil to which said cable is dedicated, so that all of the direct current ($I_{DC}$), all of the first alternating current ($I_{LF}$) and all of the second alternating current ($I_{HF}$) that are injected into the coils (1-4) are transported out and back by said cables, and respective lengths of said cables are adjusted so that the third intensities of the second alternating current are identical or substantially identical in absolute values in all of the coils in the chain.

8. Device according to claim 7, wherein the second frequency (HF) is higher than the first frequency (LF), and wherein the means (7) for injecting the second alternating current ($I_{HF}$) comprise a source (71) of the second alternating current and a primary winding (73) of a transformer (8), a current output of said source being connected to a middle point (J) of the primary winding of the transformer, and two end terminals (F, H) of said primary winding being connected respectively to the two secondary terminals (S1, S2) of the chain of coils (1-4), and wherein a secondary winding (91) of the transformer (8) belongs to the means (9) for detecting the voltage component that has the mixing frequency.

9. Device according to claim 7, wherein the means (9) for detecting the voltage component that has the mixing frequency comprise:

a first synchronous demodulator (93) that is coupled to the means (7) for injecting the second alternating current ($I_{HF}$), and which is arranged to offset the frequency of the voltage component that has the mixing frequency, by suppressing a contribution of the second frequency (HF) to said mixing frequency; and a second synchronous demodulator (94) that is coupled to the means (6) for injecting the first alternating current ($I_{LF}$), and which is arranged to offset the frequency of the voltage component that has the mixing frequency, by suppressing a contribution of the first frequency (LF) to said mixing frequency, said first (93) and second (94) synchronous demodulators being arranged in cascade so as to output a direct electrical signal output that is proportional to the amplitude of the voltage component that has the mixing frequency.

10. Device according to claim 9, wherein the second frequency (HF) is higher than the first frequency (LF),
and the means (6) for injecting the first alternating current ($I_{LF}$) are connected to the central terminal (C) of the chain of coils (1-4) by a first capacitor (C1) that is suitable for conducting alternating current at the first frequency (LF) and at the second frequency (HF);
and the means (7) for injecting the second alternating current ($I_{HF}$) are connected to each of both secondary terminals (S1, S2) of the chain of coils (1-4) by a respective second capacitor (C2) that is suitable for conducting alternating current at the second frequency (HF) but not at the first frequency (LF).

11. Device according to claim 1, wherein the second frequency (HF) is higher than the first frequency (LF),
and wherein the means (7) for injecting the second alternating current ($I_{HF}$) comprise a source (71) of the second alternating current and a primary winding (73) of a transformer (8), a current output of said source being connected to a middle point (J) of the primary winding of the transformer, and two end terminals (F, H) of said primary winding being connected respectively to the two secondary terminals (S1, S2) of the chain of coils (1-4),
and wherein a secondary winding (91) of the transformer (8) belongs to the means (9) for detecting the voltage component that has the mixing frequency.

12. Device according to claim 11, wherein the means (9) for detecting the voltage component that has the mixing frequency comprise:
a first synchronous demodulator (93) that is coupled to the means (7) for injecting the second alternating current ($I_{HF}$), and which is arranged to offset the frequency of the voltage component that has the mixing frequency, by suppressing a contribution of the second frequency (HF) to said mixing frequency; and
a second synchronous demodulator (94) that is coupled to the means (6) for injecting the first alternating current ($I_{LF}$), and which is arranged to offset the frequency of the voltage component that has the mixing frequency, by suppressing a contribution of the first frequency (LF) to said mixing frequency,
said first (93) and second (94) synchronous demodulators being arranged in cascade so as to output a direct electrical signal output that is proportional to the amplitude of the voltage component that has the mixing frequency.

13. Device according to claim 11, wherein the second frequency (HF) is higher than the first frequency (LF),
and the means (6) for injecting the first alternating current ($I_{LF}$) are connected to the central terminal (C) of the chain of coils (1-4) by a first capacitor (C1) that is suitable for conducting alternating current at the first frequency (LF) and at the second frequency (HF);
and the means (7) for injecting the second alternating current ($I_{HF}$) are connected to each of both secondary terminals (S1, S2) of the chain of coils (1-4) by a respective second capacitor (C2) that is suitable for conducting alternating current at the second frequency (HF) but not at the first frequency (LF).

14. Device according to claim 1, wherein the means (9) for detecting the voltage component that has the mixing frequency comprise:
a first synchronous demodulator (93) that is coupled to the means (7) for injecting the second alternating current ($I_{HF}$), and which is arranged to offset the frequency of the voltage component that has the mixing frequency, by suppressing a contribution of the second frequency (HF) to said mixing frequency; and
a second synchronous demodulator (94) that is coupled to the means (6) for injecting the first alternating current ($I_{LF}$), and which is arranged to offset the frequency of the voltage component that has the mixing frequency, by suppressing a contribution of the first frequency (LF) to said mixing frequency,
said first (93) and second (94) synchronous demodulators being arranged in cascade so as to output a direct electrical signal output that is proportional to the amplitude of the voltage component that has the mixing frequency.

15. Device according to claim 1, wherein the second frequency (HF) is higher than the first frequency (LF),
and the means (6) for injecting the first alternating current ($I_{LF}$) are connected to the central terminal (C) of the chain of coils (1-4) by a first capacitor (C1) that is suitable for conducting alternating current at the first frequency (LF) and at the second frequency (HF);
and the means (7) for injecting the second alternating current ($I_{HF}$) are connected to each of both secondary terminals (S1, S2) of the chain of coils (1-4) by a respective second capacitor (C2) that is suitable for conducting alternating current at the second frequency (HF) but not at the first frequency (LF).

16. Device according to claim 1, arranged so that the four coils (1-4) are all parallel to a common axis, juxtaposed to one another and have respective winding directions of the electrical wire around the cores (1N-4N) that are identical with respect to said common axis.

17. Device according to claim 1, arranged so that the four coils (1-4) are all parallel to a common axis and are split into two pairs of coils, with the coils in one and same pair (1, 2) having winding directions of the electrical wire around the cores that are identical for the two coils in said pair, and opposite to the winding direction of the coils in the other pair (3, 4), and with the coils in one and same pair being juxtaposed whereas the two pairs of coils are apart from each other perpendicular to said common axis.

18. Device according to claim 1, wherein each core (1N-4N) is in a form of a closed loop and each coil (1-4) is wound around the core of said coil perpendicular to a longitudinal direction of the loop, and the four cored coils are juxtaposed to one another over an entire loop length of the cores, and have identical electrical wire winding directions.

19. Method for measuring a magnetic field, comprising the following steps:
/1/ placing the four coils (1-4) of a device according to claim 1 in a magnetic field; and
/2/ simultaneously activating the means (6, 7) for injecting the first ($I_{LF}$) and second ($I_{HF}$) alternating currents, and adjusting the intensity of the direct current ($I_{DC}$) that is produced by the means for injecting the direct current so as to cancel the amplitude of the voltage component that has the mixing frequency, while said first and second alternating currents are injected;
the value of the intensity of the direct current ($I_{DC}$) that is produced by said direct current injection means (5), which was adjusted in step /2/, constituting a measurement result for the magnetic field.

20. Method for measuring a direct electrical current, comprising the following steps:

/1/ providing a device according to claim 1;

/2/ arranging the four coils (1-4) near the direct electrical current to be measured, called the unknown current (I), or around said unknown current so that said unknown current passes through the loops of the four cores (1N-4N) outside the coils; and /3/ simultaneously activating the means (6, 7) for injecting the first ($I_{LF}$) and second ($I_{HF}$) alternating currents, and adjusting the intensity of the direct current ($I_{DC}$) that is produced by the means (5) for injecting the direct current into the chain of coils (1-4) so as to cancel the amplitude of the voltage component that has the mixing frequency, while said first and second alternating currents are injected;

the value of the intensity of the direct current ($I_{DC}$) that is produced by said direct current injection means (5), which was adjusted in step /3/, constituting a measurement result for the unknown current (I).

\* \* \* \* \*